United States Patent
Koch et al.

(10) Patent No.: US 7,619,887 B2
(45) Date of Patent: Nov. 17, 2009

(54) ARRANGEMENT FOR COOLING ELECTRONIC MODULAR UNITS IN EQUIPMENT AND NETWORK CABINETS

(75) Inventors: Peter Koch, Vilgertshofen (DE); Rainer Bretschneider, Meissen (DE); Heiko Ebermann, Dresden (DE); Manfred Willnecker, Roβbach (DE); Harald Fonfara, Lalling (DE); Thorsten Miltkau, Deggendorf (DE); Thomas Künkler, Eichendorf (DE); Lars Weiβmann, Ebingen (DE)

(73) Assignee: Knuerr AG, Anstorf (DE)

( * ) Notice: Subject to any disclaimer, the term of this patent is extended or adjusted under 35 U.S.C. 154(b) by 156 days.

(21) Appl. No.: 11/547,240

(22) PCT Filed: Dec. 5, 2005

(86) PCT No.: PCT/EP2005/013023

§ 371 (c)(1),
(2), (4) Date: Oct. 3, 2006

(87) PCT Pub. No.: WO2006/081857

PCT Pub. Date: Aug. 10, 2006

(65) Prior Publication Data

US 2008/0285228 A1 Nov. 20, 2008

(30) Foreign Application Priority Data

Feb. 4, 2005 (DE) .................. 10 2005 005 296

(51) Int. Cl.
*H05K 7/20* (2006.01)
(52) U.S. Cl. .................. 361/696; 361/689; 361/690; 361/695; 361/698; 361/699; 165/80.4; 165/104.33
(58) Field of Classification Search .................. None
See application file for complete search history.

(56) References Cited

U.S. PATENT DOCUMENTS

| | | | | | |
|---|---|---|---|---|---|
| 5,467,250 | A | * | 11/1995 | Howard et al. | 361/696 |
| 6,026,891 | A | * | 2/2000 | Fujiyoshi et al. | 165/104.33 |
| 6,134,109 | A | * | 10/2000 | Muller et al. | 361/700 |
| 6,164,369 | A | * | 12/2000 | Stoller | 165/104.33 |
| 6,167,947 | B1 | * | 1/2001 | Hokanson et al. | 165/80.3 |

(Continued)

FOREIGN PATENT DOCUMENTS

DE 19515121 A1 10/1996

(Continued)

*Primary Examiner*—Boris L Chervinsky
(74) *Attorney, Agent, or Firm*—Harness, Dickey & Pierce, P.L.C.

(57) ABSTRACT

The invention relates to an arrangement for cooling equipment and network cabinets, particularly server cabinets, in which the fans are integrated into a door. The resulting fan door, in the closed position, covers an access area of the rear of the cabinet and longitudinally adjacent to the fan door is arranged in fixed manner an air-to-fluid heat exchanger, whilst covering a residual area of the rear of the cabinet and to which is articulated the fan door. The heat loss given off to a cooling liquid, particularly cold water, in the heat exchanger is removed via a pipe system outside the cabinet installation area and rigid connecting pipes of a gas-tight material can be used for the connection of the heat exchangers of the individual cabinets to the building-side pipe system.

23 Claims, 7 Drawing Sheets

U.S. PATENT DOCUMENTS

| | | |
|---|---|---|
| 6,234,240 B1 * | 5/2001 | Cheon ................... 165/80.3 |
| 6,488,214 B1 | 12/2002 | Nicolai et al. |
| 6,575,230 B1 * | 6/2003 | Kadota et al. .......... 165/104.33 |
| 6,742,583 B2 * | 6/2004 | Tikka .................... 165/291 |
| 6,775,137 B2 * | 8/2004 | Chu et al. ............... 361/696 |
| 6,819,563 B1 | 11/2004 | Chu et al. |
| 7,011,576 B2 * | 3/2006 | Sharp et al. ............ 454/184 |
| 2001/0042616 A1 | 11/2001 | Baer |
| 2003/0085025 A1 * | 5/2003 | Woods et al. .......... 165/104.33 |
| 2004/0100770 A1 | 5/2004 | Chu et al. |
| 2005/0237714 A1 | 10/2005 | Ebermann |

FOREIGN PATENT DOCUMENTS

| | | |
|---|---|---|
| DE | 19825602 A1 | 12/1999 |
| DE | 10210417 | 10/2003 |
| DE | 10210418 A1 | 10/2003 |
| DE | 202004006552 U1 | 7/2004 |
| WO | 01/72099 A2 | 9/2001 |

* cited by examiner

ARRANGEMENT FOR COOLING ELECTRONIC MODULAR UNITS IN EQUIPMENT AND NETWORK CABINETS

FIELD

The invention relates to an arrangement for cooling electronic modular units in equipment and network cabinets, particularly server cabinets, in an installation area.

BACKGROUND

DE 195 15 121 C2 discloses a housing structure for electrical and/or electronic equipment installable outdoors. The outdoor housing structure comprises an inner cabinet and an outer cabinet spaced therefrom. A cooling air fan placed in the bottom of the outer cabinet sucks a cooling air flow out of the environment and into the outer cabinet, which is provided with upper outlets. An air heat exchanger in the inner cabinet, which is supplied the cooling air from the outer cabinet, and circulating fans ensure a recycled inside air flow. In addition, the electrical and electronic equipment are placed on cooling elements, which are held in the wall openings of the inner cabinet and are connected to the interior of the inner cabinet.

DE 102 10 418 A1 discloses a switch cabinet with a cooling device constructed as a rear wall and which has an air-to-water heat exchanger and blower. The partial hot air flows from the interior of the switch cabinet are subject to suction action and returned as cooled air, via a ventilating duct placed beneath the interior and an air retaining chamber on the front, to the interior of the cabinet.

A modular switch cabinet system according to DE 198 25 602 C2 is provided with a set of doors, which in each case have at least one fan, are replaceable and constructed for the reception of a cooling module, e.g. a compressor cooler, an air-to-air heat exchanger or an air-to-water heat exchanger in accordance with the given requirements.

DE 20 2004 006 552.5 U1 discloses an equipment and network cabinet, particularly a server cabinet, with electronic modular units, particularly servers located in the interior and an air-to-water heat exchanger placed in the lower cabinet area and which is connected to the cold water supply of the building.

As a result of air circulation with air paths of equal length and therefore identical flow resistances for the individual modular units and due to technical separation between the cold supply air and the heated exhaust air, it is possible to supply to the individual modular units cold supply air with an almost uniform supply air temperature. The removal of the heat loss of the electronic modular units received in a housing with a fan, takes place by means of a closed cooling air circuit, which has a supply air duct, particularly at the front and extending over the arrangement of the electronic modular units for the supply air cooled in the bottom air-to-water heat exchanger, as well as an exhaust air duct, which has behind the electronic modular units a first duct section for a rising exhaust air flow and a second duct section for a falling exhaust air flow and which is located in the rear door of the cabinet. The deflection of the exhaust air flow takes place with the aid of fans in the upper area of the rear door and advantageously the latter has a right-hand and a left-hand falling exhaust air duct through which exhaust air is supplied to the air-to-water heat exchanger.

U.S. Pat. No. 6,819,563 B1 discloses an equipment cabinet installable in a room for electronic equipment or components provided with a blower. Air conditioned ambient air is supplied for cooling the electronic components in this indoor equipment cabinet. The ambient air is cooled by means of an entrance heat exchanger located in the equipment cabinet and which is supplied with cooling water. The air then passes into the superimposed, stacked electronic equipment and is then returned as heated exhaust air to the installation room. In addition, an exit heat exchanger can be located in the equipment cabinet and cools the heated exhaust air before the latter is delivered to the ambient air.

In the equipment cabinet of US 2004/0100770 A1 the heat loss of superimposed electronic components is removed with the aid of blowers and combined air-liquid cooling. On at least one side of a cabinet an air-to-liquid heat exchanger is installed. Blowers are located in a separate housing and are connected to the reception area. Alternatively, the air-to-liquid heat exchanger units can be arranged in the form of a front and rear door. A closed cooling air circuit is made possible by the formation of a supply or removal area in the doors, as well as a connecting area below and/or above the stack arrangement. Additional fans can be located in the supply and removal areas. The heat exchanger doors are articulated to the cabinet body for accessing the reception area and electronic components and equipment.

DE 102 10 417 B4 describes an arrangement for cooling a switch cabinet in which the heat loss of superimposed, heat-generating components is removed with the aid of a heat exchanger rear wall or a rear wall heat exchanger cabinet and a cooling air flow of a central cooling installation. The cooling air flow of the central cooling installation passes from a double bottom below the switch cabinet into a frontally constructed supply air shaft. The heated exhaust air is cooled with the aid of downstream fans in the heat exchanger rear wall or rear wall heat exchanger cabinet using an air-to-water heat exchanger and is either returned to the double bottom below the switch cabinet or to the switch cabinet ambient air. The central cooling installation supplies both the switch cabinet ambient air and the double bottom and consequently, the interior of the switch cabinet with cooling air, so that a relatively complicated control arrangement is necessary to achieve the necessary cooling capacity in each case.

WO 01/72099 A2 and US 2001/0042616 A1 disclose a cooling system for equipment and network cabinets serving to flexibly and effectively remove the heat loss of high power, densely packed, electronic modular units in a plurality of cabinets strung together in an installation area or room. The cooling system is intended to supplement the room air conditioning and make it less expensive, in that the exhaust air heated in a cabinet is supplied by fans to an air-to-fluid heat exchanger, cooled to ambient temperature and delivered to the ambient air. The fans and heat exchanger are housed in an additional housing fixed to the rear of the cabinet. The exhaust air from the cabinet passes via an opening in the cabinet rear wall or door and a complementary opening in the engaging heat exchanger fan housing into the interior of the housing. The air is guided by means of the air-to-fluid heat exchanger in the vicinity of the housing opening by means of downstream fans, and via the housing outer wall, is delivered to the environment.

According to a data sheet of the applicant of WO 01/7209912 and US 2001/0042616 A1, Messrs. Liebert, Columbus, Ohio 43229, USA: RackCooler, System Configuration Guide, drawing number 171439, rev. 07, Jun. 12, 2002, pp 1 to 8 and the associated installation manual SL-16810 (9/01), pp 1 to 10, the so-called RackCooler, i.e. the housing unit with an air-to-water heat exchanger and superimposed fans is fixed externally to the rear door of cabinets, and cooling water delivering the absorbed heat loss outside the cabinet installation area, is supplied to each RackCooler by means of a ground-installed pipe system and connecting hoses between the pipe system and each RackCooler. Disadvantages of the retrofitting of existing doors are system downtimes during retrofitting, possible overloading of existing closure and hinge elements, low efficiency relative to the space requirement due to the restriction of the areas available for cooling purposes due to taking account of existing closure and hinge means, and a relatively small opening angle of the retrofitted door.

The connecting hoses extending from the bottom-side connection points to the connections on each RackCooler must, due to the placing of the RackCooler on the rear doors, have a relatively flexible construction and must be able to follow the swinging movement of the doors. Therefore, the disadvantage arises of the connecting hoses only having an inadequate mechanical stability and robustness. The hoses also lack the necessary gas-tightness, so that due to gas diffusion, corrosion of the heat exchanger pipes can take place.

SUMMARY

The object of the invention is to provide an arrangement for cooling electronic modular units in equipment and network cabinets, particularly cabinet rows in an installation area or room. The arrangement shall provide a simple design and stable construction and ensure the necessary accessibility to the reception area and an extremely efficient removal of the heat loss of the electronic modular units.

According to the invention the object is achieved by the features of claim 1. Appropriate and advantageous developments appear in the dependent claims and description relative to the drawings.

A fundamental idea of the invention is to construct a rear cooling arrangement with an air-to-fluid heat exchanger and fans in such a way that there is no need for a pivoting movement of the heat exchanger or heat exchanger unit and therefore the need for flexible connecting hoses while simultaneously ensuring access to the rear of the cabinet. The term air-to-fluid heat exchanger is understood to mean an air-to-liquid heat exchanger.

According to the invention an arrangement with an air-to-fluid heat exchanger, particularly an air-to-water heat exchanger, which is connected to the cold water supply of a building and removes the heat loss to outside the cabinet installation area is design-separated from a fan arrangement, which supplies the air-to-fluid heat exchanger the exhaust air of the electronic modular units of a cabinet. According to the invention the fans are integrated into a door, preferably a rear door of a cabinet. Such a fan door preferably extends over the entire cabinet height and at least over the height of the reception area for the electronic modular units, e.g. servers, and allows access to the servers, also from the rear. Such a rear access is particularly advantageous when blade servers are used and which are generally received in a stack arrangement so as to be extractable rearwards instead of forwards.

According to the invention, design-separated from the fan door, the air-to-fluid heat exchanger is placed in fixed manner on the rear of the cabinet whilst covering a residual area of the cabinet rear, i.e. at least the area not covered by the fan door.

The advantage of a rigid, appropriately dismantable arrangement of the air-to-fluid heat exchanger longitudinally and preferably vertically alongside the fan door and adjacently connected thereto preferably by means of hinges is that there can be rigid pipes for connecting the pipe system for the cooling fluid laid under the floor with each air-to-fluid heat exchanger of a cabinet. There is no longer a need for flexible connecting hoses, because the air-to-fluid heat exchanger is fixed in a stationary, and not pivotable, manner to the cabinet rear. The rigid pipes can be made from a gas diffusion-tight material, which are in principle known from heating engineering. Through excluding gas diffusion in the vicinity of the connecting pipes, there is no or only a greatly reduced corrosion risk in the vicinity of the heat exchanger leading to a longer service life.

It is advantageous that the fan door and longitudinally adjacent air-to-fluid heat exchangers are constructed as a retrofittable unit and can replace a conventional cabinet rear wall or door if there is a need for a much more efficient heat loss removal.

The possible retrofitting also gives the advantageous possibility of providing, with relatively low capital and operating costs, a high-power cooling, particularly in commercial computer centres with up to 100 cabinets, of individual cabinets in a planned manner with the inventive fan door and the adjacent, fixed air-to-fluid heat exchanger. This makes it possible to optimize the equipping of the cabinets and also the filling of the room or area with such cabinets, whilst simultaneously reducing costs for the air conditioning thereof.

Appropriately, in the fan door fans, preferably centrifugal fans, are arranged in uniformly spaced and in a particular superimposed manner and are directly or indirectly fixed to an inside and outside of the housing-like fan door. For removing the exhaust air from the reception area of the cabinet, complementary openings are provided on the inside of the fan door and, after deflecting by approximately 90°, the air passes through an at least zonally air-permeable connection side of the fan door into the adjacent air-to-fluid heat exchanger. An entrance side of the heat exchanger housing can advantageously be made air-permeable or perforated in the same way as the, connection side of the fan door, and a parallel, air-permeable constructed exit side of the heat exchanger housing permits the discharge of the cooled air into the cabinet environment.

The supply of cooling air 38 from the environment of the cabinets in the reception area or room generally takes place in the vicinity of the front cabinet door and the electronic modular units particularly in a stack arrangement and can in each case have a fan in their housings.

The fan door is appropriately articulated by means of hinges to the heat exchanger and can be pivoted from a closed position into an open position. A 180° open position is particularly advantageous because it allows an advantageous access to the electronic modular units and to the cabling area on the back of the cabinet. Appropriately there are corresponding seals in the vicinity of the cabinet rear and/or the adjacent fan door and between the fan door and the heat exchanger housing, so that in the operating position, i.e. with the fan door closed, there is an efficient removal of the heated exhaust air, while cooling and delivering the same to the ambient air.

It is advantageous that the fan door and/or the air-to-fluid heat exchanger can be constructed for cabinets and rear access areas of different widths. For cabinets with a width of approximately 750 mm and a heat exchanger unit with a width of approximately 210 mm, an access area approximately 665 mm wide can be obtained through a laterally projecting heat exchanger arrangement. If the outside of the fan door is beveled adjacent to the closing side of the fan door, an advantageous pivoting movement of the rear fan door of the adjacent cabinet is made possible.

It is also advantageous with a cabinet, for example, having a width of 600 mm and preferably intended for blade servers, that the same heat exchanger unit can be fixed to the rear of the cabinet, more particularly, aligned with a side wall. The fan door then has a smaller width, for example, approximately 350 to 400 mm, but this is adequate for operating the blade server from the rear. The fan door can be articulated to the outer wall of the heat exchanger by means of hinges and can be pivoted into an open position by 180° using a vertical pivot pin. The superimposed fans are fixed to the inside of the door in the vicinity of, for example, nozzle-shaped insertion openings and preferably extend to the outer wall of the fan door, it being possible to provide spacing retention. The fan door closing device is appropriately adapted to the door construction and is located on the closing side of the fan door facing the heat exchanger side.

It falls within the scope of the invention to provide further construction variants for the inventive arrangement of a rigidly fixed air-to-fluid heat exchanger and a fan arrangement constructed as a fan door. For example, the fan door can be articulated to the cabinet rear wall on its side opposite to the heat exchanger. The closing side of the door would then be on the heat exchanger side. The advantages of such a construction are that the fan door does not have to be carried by the heat exchanger unit and the loads are symmetrically distributed over the cabinet to be retrofitted. It can also be expected that it is easier to control sealing at the joining point between the fan door and heat exchanger module. More specifically, with the prestressing of the seal, decreasing the sealing action is not dependent on the rotation angle and also the contact pressure can be influenced by the closing device. It is also advantageous that with such a construction the free flow cross-section between the fan door and heat exchanger unit can be made larger, which leads to lower pressure losses.

In a variant, the hinge jointing of the fan door can be located on an additional structure, so that the pivot pin is spaced from the cabinet rear. By placing the fulcrum of the fan door at a distance from the cabinet rear, there are more degrees of freedom regarding the opening angle of the fan door.

According to a further development of the invention, the heat exchanger is positioned rigidly, but its housing is at least partly pivotable. This avoids the disadvantages of a pivotable arrangement of the heat exchanger. Simultaneously, the heat exchanger module can be provided with a heat exchanger door, which is articulated to a vertical pivot pin and allows access to the heat exchanger. The separating plane between fan door and heat exchanger door is determined by the arrangement and space requirement of the fans and the heat exchanger. Through both doors being pivotable about lateral, facing rotation axes, there can be an advantageous sealing action in the vicinity of the adjacent separating or sealing plane. An advantage of greater access to the cabinet from the rear is possible if both doors are opened.

A rigid arrangement of at least one heat exchanger and a pivotable fan door can, in a further variant, also be achieved in that the cabinet rear has two door halves and fans and a heat exchanger located in each half. According to the invention, each heat exchanger is positioned rigidly and each door or half-door with the fans, for example, two fans, is pivotably articulated about an axis, such as in the vicinity of the heat exchanger. This design variant also gives good access to the cabinet. A redundancy exists, because the separating plane between the door halves is free, so that the fans can act on both heat exchangers. There is uniform heat removal on the back of the electronic modular units when the doors are open.

According to a development the at least one heat exchanger and the fans can be located in a door leaf, which essentially covers the entire cabinet back. The heat exchanger is fixed rigidly and the fan door is pivotably arranged about a longitudinal axis. Essential additional advantages of this arrangement are good access from the cabinet rear and a cooling capacity even when the doors are open.

The cooling arrangement according to the invention is preferably provided for an air circulation in which the exhaust air from the cabinet reception area passes into the fan door and then into the fixed installed heat exchanger. It falls within the scope of the invention to pass the exhaust air flow from the cabinet first through the heat exchanger and then via the fan door to the environment.

An advantageous esthetic overall impression arises if the heat exchanger housing and the fan door, at least in the vicinity of the fan arrangement, have virtually the same depth.

The essential advantages of the cooling arrangement according to the invention are the retrofittability and the use of gas-tight, rigid connecting pipes for the cooling medium made possible by the rigid fixing of the heat exchanger unit.

As a result of the rigid arrangement of the heat exchanger there is also an advantageous possibility of making rigid the interface with different cabinet constructions, e.g. using screw connections, and the hinges and pivot bearings necessary for the pivoting movement of the movable part, particularly the fan door, can be made uniform for all cabinet types and sizes. This significantly simplifies the retrofitting of existing equipment or network cabinets.

DRAWINGS

The invention is described in greater detail hereinafter relative to the attached drawings, that show.

DESCRIPTION

FIGS. 1 to 5 show a cabinet 2, particularly a server cabinet, with the cooling arrangement according to the invention on the rear thereof. For cooling the electronic modular units 4, particularly servers in a stacked arrangement located in a reception area 3, in the vicinity of the rear of the cabinet are provided a fan door 6 and an air-to-fluid heat exchanger 7, which in a longitudinally adjacent manner extending over the entire cabinet height, replace a conventional rear wall or door.

Figure 1:
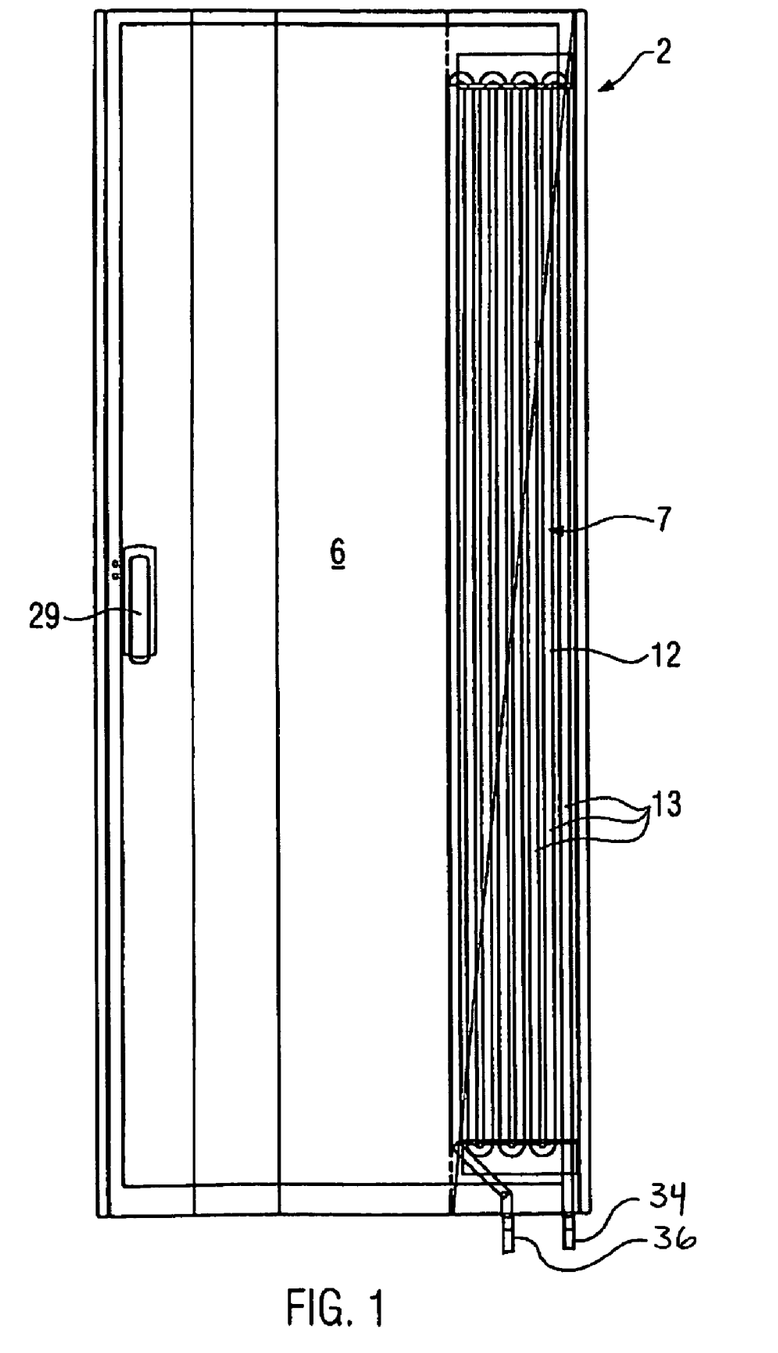
FIG. 1 A view of the rear of an equipment and network cabinet with the arrangement according to the invention.
Figure 2:
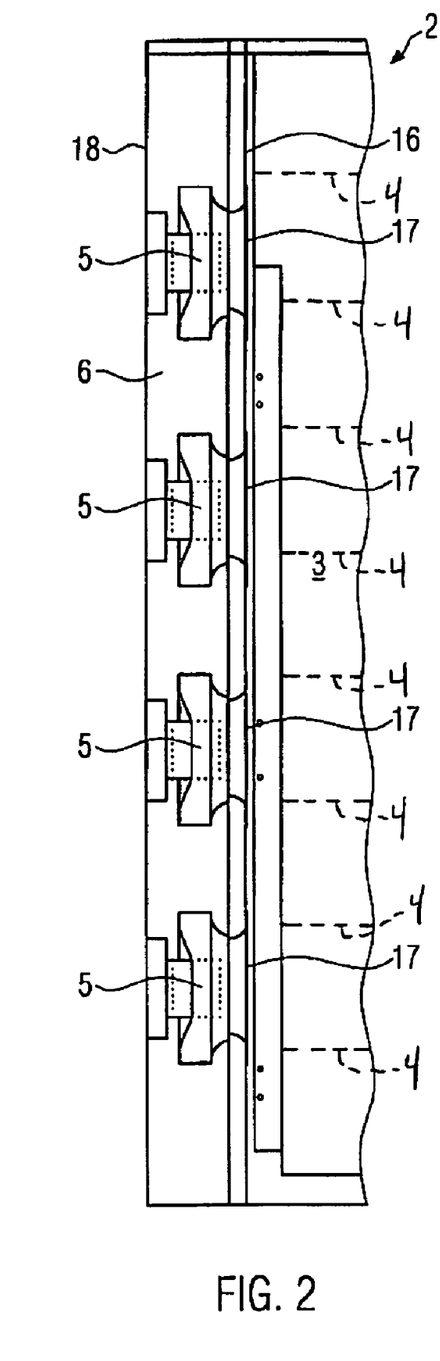
FIG. 2 A longitudinal section along line II-II of the equipment and network cabinet of FIG. 4.
Figure 3:
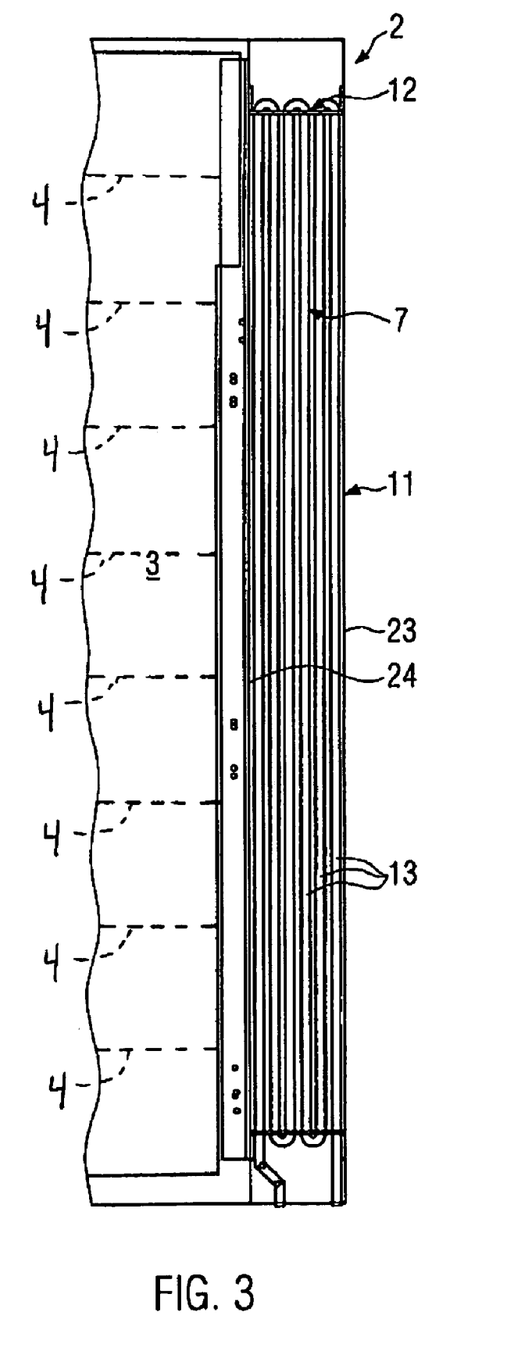
FIG. 3 A longitudinal section along line III-III of the equipment and network cabinet of FIG. 4.
Figure 4:
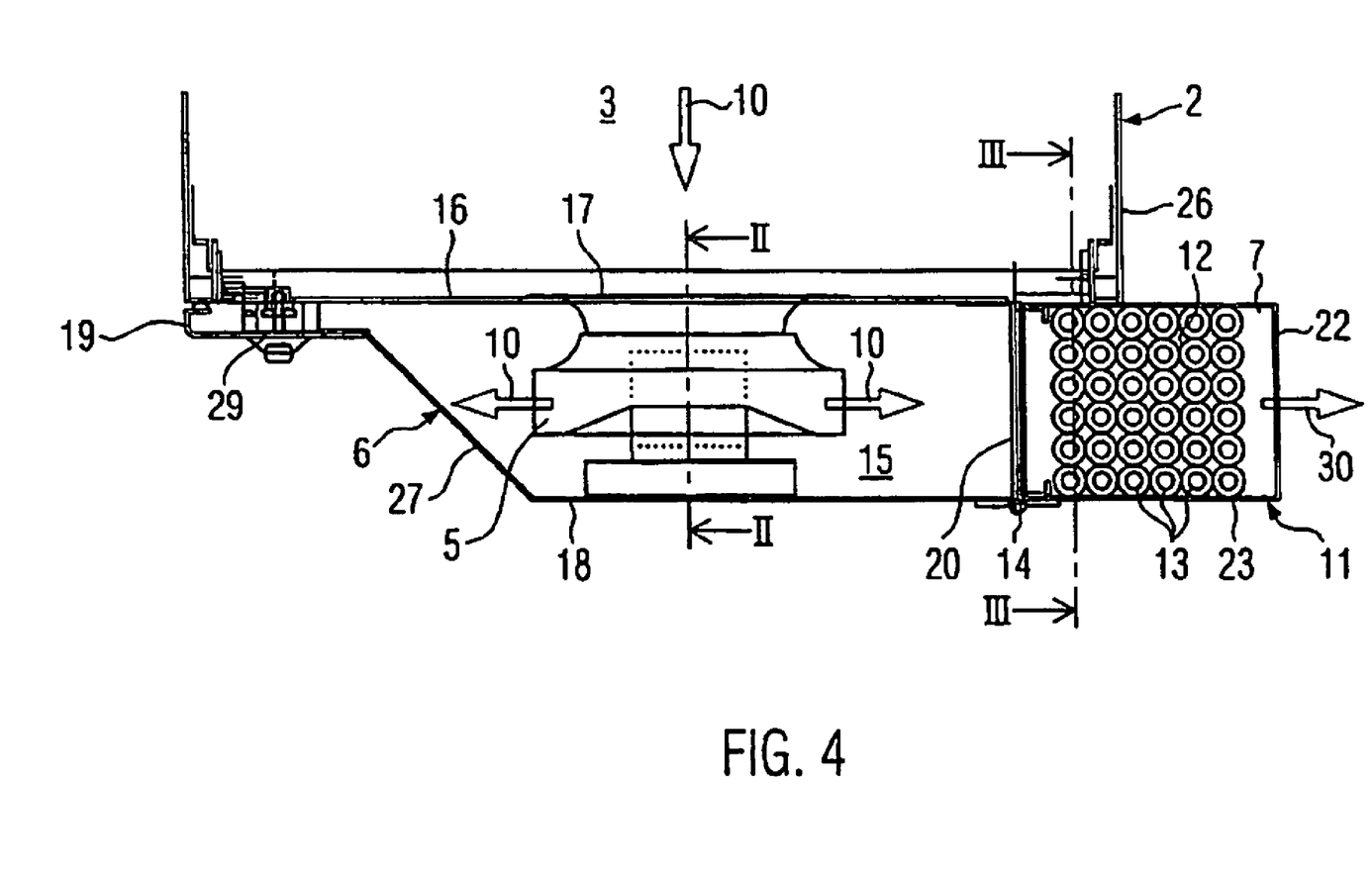
FIG. 4 A cross-section through the inventive arrangement and the rear area of the equipment and network cabinet according to FIG. 1, in the closed position.

In this embodiment the fan door 6 has four superimposed fans 5 (FIG. 2), which extend from an inside 16 to an outside 18 of fan door 6 and suck exhaust air 10 from the reception area 3 of cabinet 2 via openings 17 in the inside 16 and subject it to a roughly 90' deflection (FIG. 4). Consequently, the exhaust air 10 passes into an exhaust air area or room 15 of the fan door 6 formed by the inside 16 and outside 18, together with a closing side 19 and connecting side 20. The closing side 19 is provided a closing device 29 with which the fan door 6 can be closed in the operating position shown in FIG. 4. The reception area 15 of the fan door 6 is connected by means of a sealed and at least zonally air-permeable or perforated connecting side 20 to the air-to-fluid heat exchanger 7, whereby an entrance side 21 of a heat exchanger housing 11 constructed in an air-permeable or perforated manner is directly adjacent to the connecting side 20 of the fan door 6 (FIG. 4). The exhaust air 10 entering the heat exchanger 7 is cooled and by means of an exit side 22 parallel to entrance side 21 is delivered as cooled exhaust air 30 to the ambient air of the installation room of cabinets 2, preferably at ambient temperature.

Due to the fact that the fans 5 are uniformly spaced and extend over the entire height of the cabinet or reception area 3 (FIG. 2) efficient exhaust air cooling adaptable to the requirements is ensured. The air-to-fluid heat exchanger 7 which, in this embodiment, is a finned heat exchanger and has a pipe-fin package 12 of vertically oriented pipes 13, for example, copper pipes and cooling fins, through the connection to the building cooling water supply makes it possible to remove the heat loss to outside of the cabinet reception area or room.

As the heat exchanger 7, with its heat exchanger housing 11, is arranged in fixed, but dismantlable manner in the vicinity of the rear of cabinet 2 and is not involved in the pivoting movement of fan door 6, rigid connecting pipes 34, 36 can be used between heat exchanger 7 and a building-side cold water supply pipe system (not shown). Such rigid connecting pipes 34, 36 are constructed in a gas-tight manner and prevent corrosion of pipes 13, which is generally unavoidable with the flexible connecting hoses required for pivotably located heat exchangers.

The articulation of the fan door 6 to the fixed air-to-fluid heat exchanger 7 takes place by means of hinges 14 located in the vicinity outside 18 of fan door 6 and the outer wall 23 of heat exchanger housing 11 and ensure a pivoting about a vertical pivot pin 25.

Figure 5:
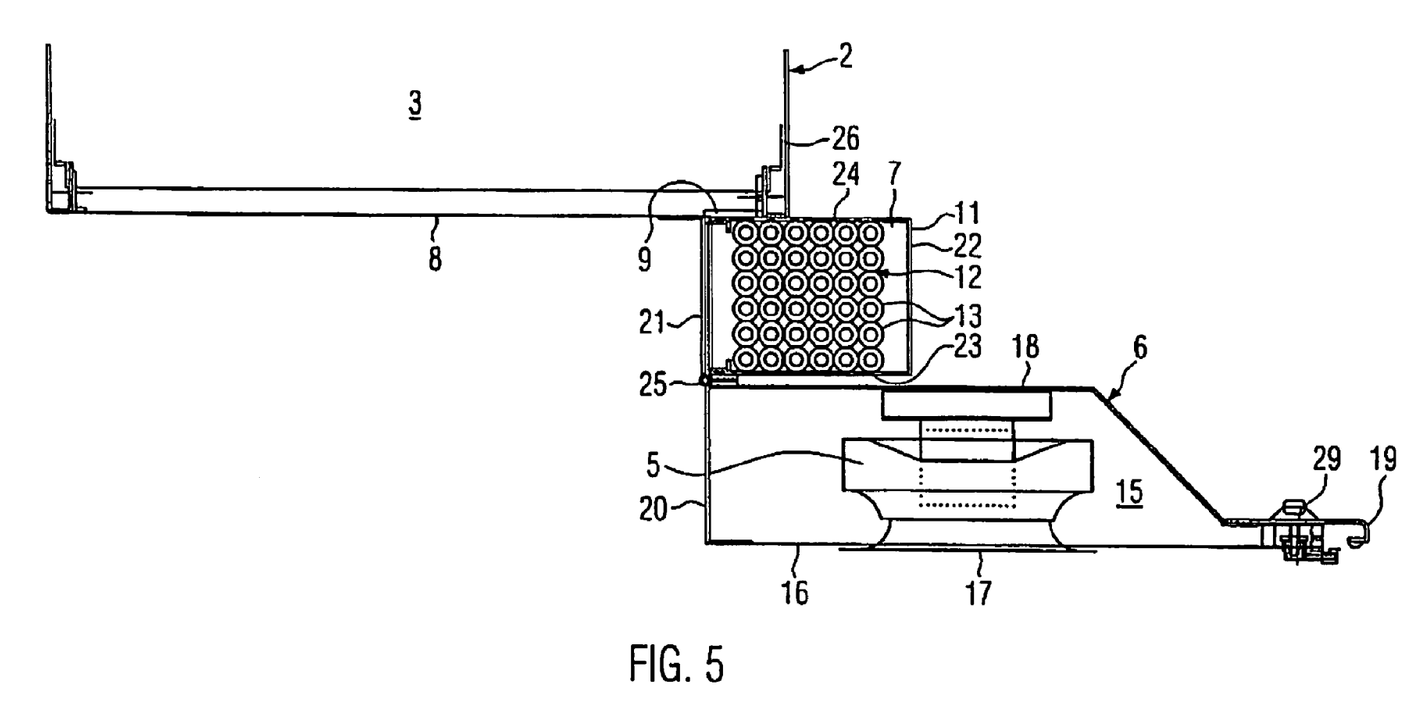
FIG. 5 A cross-section identical to FIG. 4, but with the inventive arrangement in the open position.

The cabinet of FIGS. 1 to 5 has a width of approximately 750 mm and the fan door 6 is provided with a bevel 27 between closing device 29 and fans 5. This bevel is advantageous for a generous open position (FIG. 5) with access via an access area 8. The relatively wide access area 8 is also brought about by a projecting arrangement of the air-to-fluid heat exchanger 7 (FIGS. 4 and 5). An adjacent cabinet is then positioned in a correspondingly spaced manner and the beveled construction of the fan door 6 also permits access to an adjacent cabinet, even if the fan doors 6 of both cabinets are opened according to FIG. 5. The projecting air-to-fluid heat exchanger 7 only covers a relatively narrow residual area 9 of the back of cabinet 2.

Figure 6:
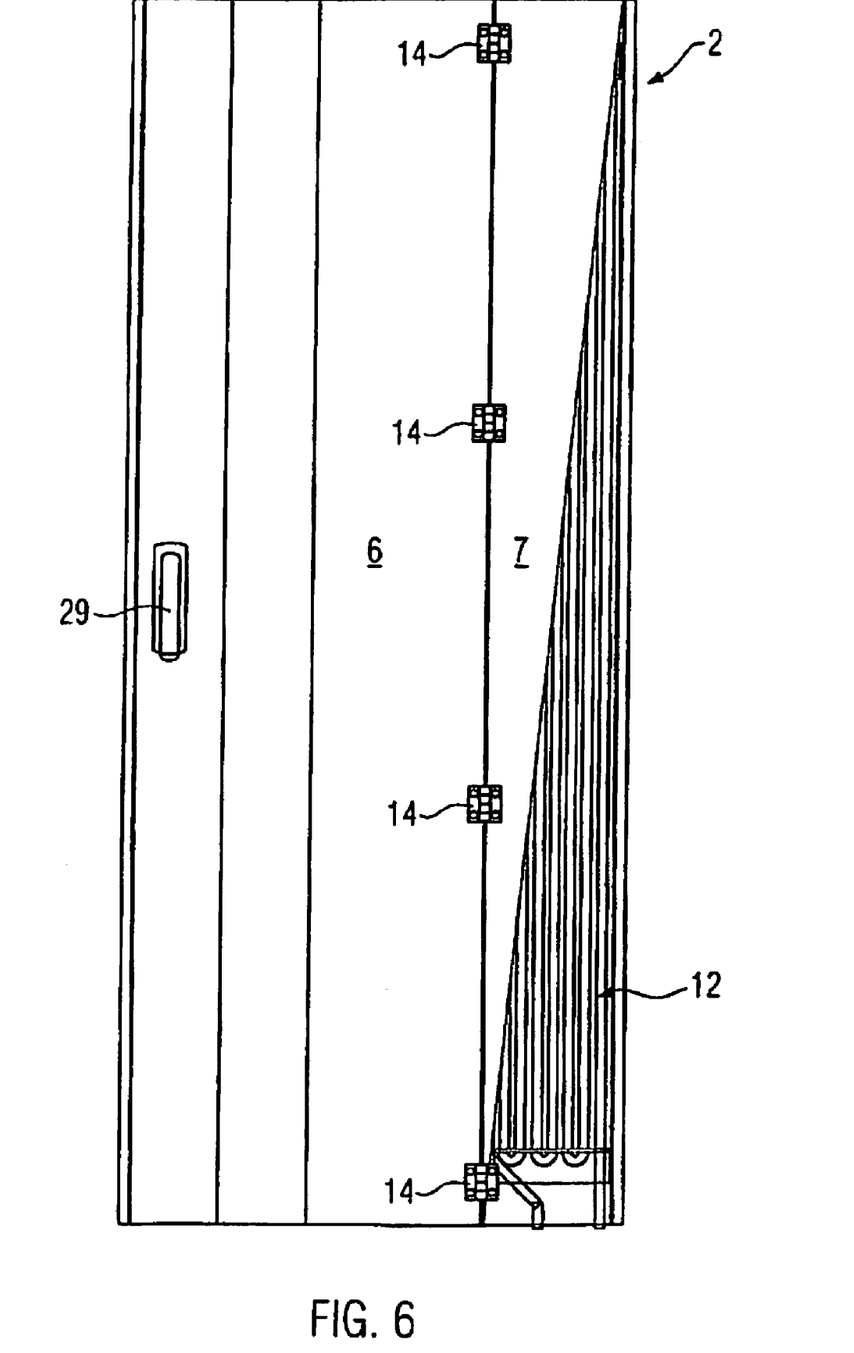
FIG. 6 A view of the rear of an equipment and network cabinet with an alternative inventive arrangement.
Figure 7:
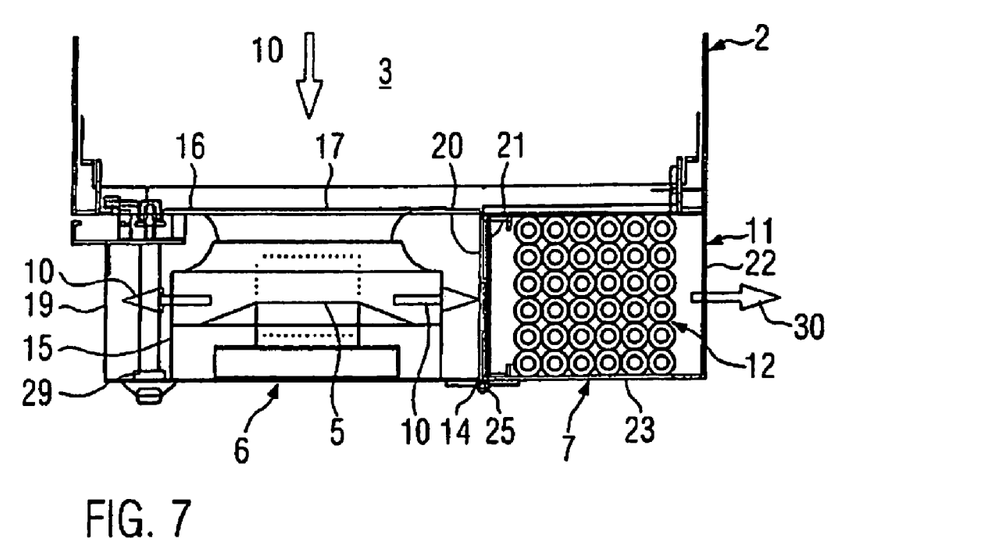
FIG. 7 A cross-section through the inventive arrangement and rear area of the equipment and network cabinet according to FIG. 6, in the closed position.
Figure 8:
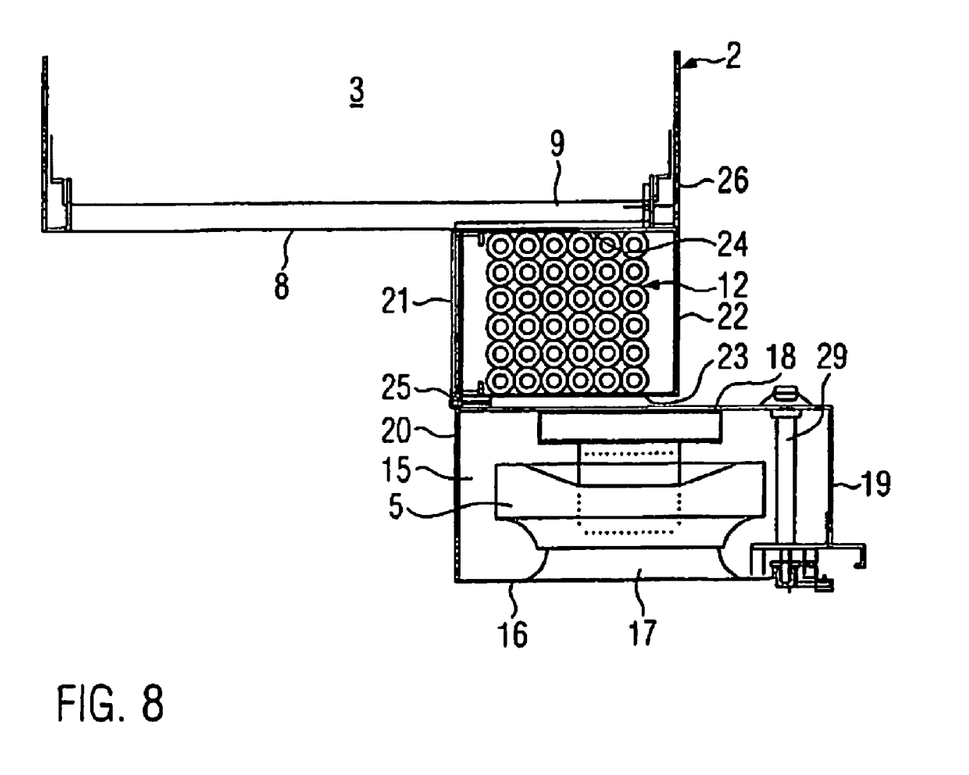
FIG. 8 A cross-section identical to FIG. 7, but in the open position of the inventive arrangement.
Figure 9:
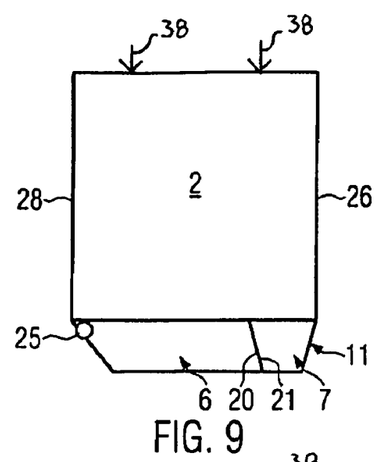
FIGS. 9 to 13 In highly diagrammatic form, alternative constructions of the inventive arrangement.

In an alternative arrangement shown in FIGS. 6 to 8, the substantially identically constructed air-to-fluid heat exchanger 7 is flush with a side wall 26 of cabinet 2 (FIGS. 7 and 8). Therefore, the heat exchanger 7 covers a wider residual area 9 of the rear of cabinet 2 and the access area 8 closed by a fan door 6 in the closed position is narrower. However, this access area 8 still permits the extraction of electronic modular units when the fan door 6 according to FIG. 8 is open, particularly in the case of a blade server (not shown).

Also in the fan door 6 of cabinet 2 of FIGS. 6 to 8 there are four superimposed fans 5 which suck exhaust air 10 from reception area 3 into door exhaust air area 15. Following a roughly 90° deflection, the exhaust air 10 passes into heat exchanger 7 and is delivered to the environment after cooling by the cooling liquid, particularly cooling water in pipes 13, using an exit side 22.

In FIGS. 6 to 8 identical reference numerals are used for identical features. The cooling arrangement manufacturable as a modular unit from a pivotable fan door 6 and a fixed exchanger 7 is able to replace a rear side or door of a cabinet. The fan door 6 of FIGS. 6 to 8, which is narrower than that of FIGS. 1 to 5, has a correspondingly adapted closing device 29 and can be brought about a vertical pivot pin 25 into an open position pivoted by 180° (FIG. 8).

FIGS. 9 to 13 show alternative constructions of the arrangement of the retrofittable cooling arrangement. Unlike in FIGS. 6 to 8, in FIG. 9 the fan door 6 is articulated at the rear to cabinet 2 instead of to the air-to-fluid heat exchanger 7 or heat exchanger housing 11. Fan door 6 and air-to-fluid heat exchanger 7 extend over the rear of cabinet 2 and the connection side 20 of fan door 6 is beveled in complementary manner to the entrance side 21 of heat exchanger housing 11, so that the cross-section for air transfer is increased.

Figure 10:
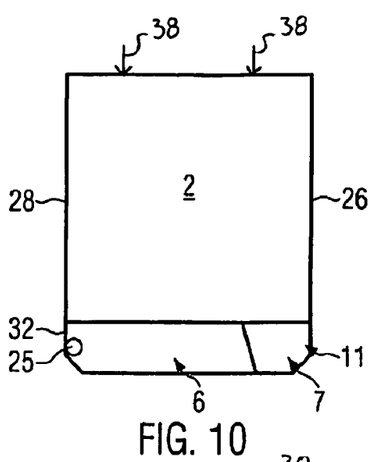

FIG. 10 shows a fan door 6 which is articulated on the side opposite to the air-to-fluid heat exchanger 7. However, the pivot pin 25 is not located directly on cabinet 2 or in the vicinity of a side wall 28 of cabinet 2 and is instead positioned on an auxiliary structure 32, for example, side wall 28, and therefore is spaced from the cabinet rear. Due to the resulting larger opening angle there is a better accessibility to the cabinet.

Figure 11:
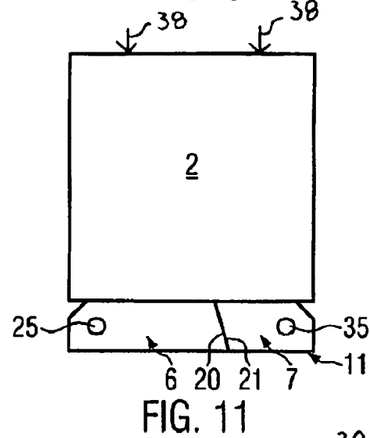

In FIG. 11 fan door 6 about the externally located pivot pin 25 and heat exchanger housing 11 about the facing vertical pivot pin 35 can be pivoted outwards, so that the access width is virtually unrestricted. In the vicinity of the adjacent connection side 20 and entrance side 21 a corresponding seal is provided, which can advantageously be assisted by the closing device (not shown) to be located here.

Figure 12:
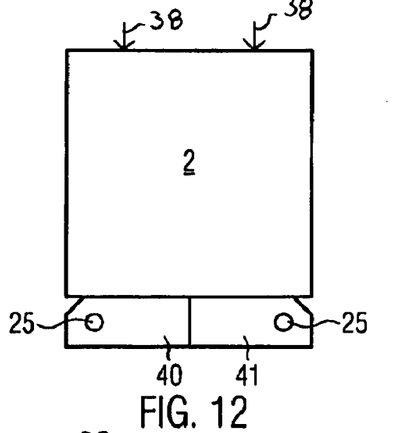

FIG. 12 shows a further development in which the inventive arrangement of fans and rigidly positioned heat exchangers (not shown) is implemented in a left-hand door 40 and a right-hand door 41, which, for example, in the manner shown, can be constructed as door halves. The exhaust air from the cabinet 2 can be supplied by means of fans (not shown) to each heat exchanger in each door 40, 41, so that a particularly uniform heat removal is ensured.

Figure 13:
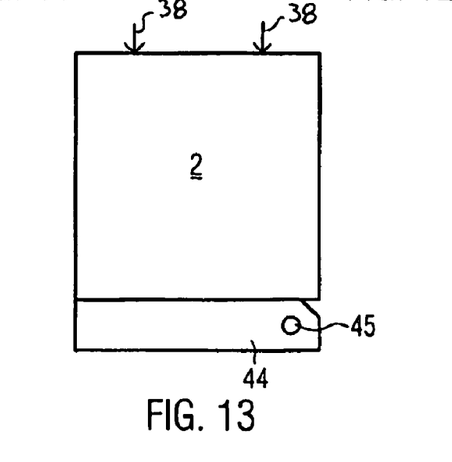

In the alternative construction according to FIG. 13 there is only one door 44 on the rear of cabinet 2. In the vicinity of the door 44, which can be brought into an open position about a pivot pin 45, there is once again a heat exchanger (not shown) which is rigidly positioned, and with said door 44 only pivoted, the fans are located therein.

The invention claimed is:

1. An apparatus for cooling electronic modular units, the apparatus comprising:
   a cabinet, the cabinet being an equipment, server and network cabinet in an installation area, the cabinet defining a front and a rear, the rear further defining a rear access area; and
   a plurality of fans located in a vicinity of the rear of the cabinet, the fans for removing a heat loss produced by the electronic modular units;
   wherein:
   an air-to-liquid heat exchanger is positioned longitudinally on the cabinet and covers an area of the rear of the cabinet;
   a door, the fans are integrated into the door to form a fan door, the fan door in a closed position covers the rear access area of the cabinet, the air-to-liquid heat exchanger is positioned adjacent to the fan door and covers a residual area of the rear of the cabinet, the residual area is an area of the cabinet not covered by the fan door; and a front supply of cooling air from an environment of the cabinet is used with the air-to-liquid heat exchanger and with the fans to remove heat loss produced by the electronic modular units, the fans to suck exhaust air of the electronic modular units supplied with the heat loss out of the cabinet and, prior to delivery to the ambient air surrounding the cabinet, pass the exhaust air through the air-to-liquid heat exchanger for cooling purposes.

2. The apparatus according to claim 1, wherein the fans located in the fan door are centrifugal fans, and the exhaust air from the cabinet is deflected 90° within the fan door and is supplied to the air-to-liquid heat exchanger adjacent to the fans.

3. The apparatus according to claim 1, wherein the fan door is articulated to the air-to-liquid heat exchanger and is pivotable from a closed position by up to 180° into an open position.

4. The apparatus according to claim 1, wherein cooling liquid of the air-to-liquid heat exchanger absorbs and delivers the heat loss to outside of the installation area of the cabinet.

5. The apparatus according to claim 1, wherein the air-to-liquid heat exchanger is an air-to-water heat exchanger.

6. The apparatus according to claim 1, wherein the air-to-liquid heat exchanger further comprises a pipe-fin package in a heat exchanger housing with vertically oriented pipes for containing cooling liquid, particularly for cold water from a cold water supply.

7. The apparatus according to claim 1, wherein the fan door is a housing and has an inside with openings for the exhaust air to be sucked out of the cabinet, an outside surface of the housing in the vicinity of the fans is positioned parallel to an inside surface of the housing, a closing side is parallel to a connection side, which is adjacent to an entrance side of the heat exchanger housing and the connection side and the entrance side of the heat exchanger housing are zonally perforated.

8. The apparatus according to claim 1, wherein the heat exchanger housing has an exit side facing the entrance side and through which passes out the exhaust air cooled to roughly ambient temperature in the air-to-liquid heat exchanger.

9. The apparatus according to claim 1, wherein the fan door is constructed for different widths of cabinets and different widths of rear access areas.

10. The apparatus according to claim 1, wherein the air-to-liquid heat exchanger is fixed in a dismantlable manner in the rear area of the cabinet.

11. The apparatus according to claim 1, wherein the air-to-liquid heat exchanger is aligned with a side wall of the cabinet.

12. The apparatus according to claim 1, wherein the fan door can be pivoted about a vertical axis with hinges, which are located on an outside of the fan door and an outer wall of the heat exchanger housing.

13. The apparatus according to claim 1, wherein the pipe-fin package of the air-to-liquid heat exchanger is connected by connecting pipes made from a gas diffusion-tight material to the cold water supply.

14. The apparatus according to claim 1, wherein in the fan door are juxtaposed several fans that are fixed to the inside surface of the housing and the outside surface of the housing.

15. The apparatus according to claim 1, wherein the air-to-liquid heat exchanger, like the fan door, extends over the height of the cabinet and at least over the height of the reception area.

16. The apparatus according to claim 1, wherein the fan door and air-to-liquid heat exchanger are constructed as retrofitting units.

17. The apparatus according to claim 1, wherein the fan door is articulated to the cabinet and can be pivoted by up to 180° from a closed position into an open position.

18. The apparatus according to claim 17, wherein the fan door with a beveled connection side engages in sealed manner on an entrance side of the heat exchanger housing.

19. The apparatus according to claim 17, further comprising a pivot pin located on an auxiliary structure of the cabinet.

20. The apparatus according to claim 17, wherein the air-to-liquid heat exchanger is placed in rigid manner on the rear of the cabinet and the heat exchanger housing is movable about a pivot pin into an open position.

21. The apparatus according to claim 17, wherein on the rear of the cabinet are provided two fan doors in a vicinity of which in each case is a heat exchanger, the fan doors movable into an open position about pivot pins.

22. The apparatus according to claim 17, wherein on the rear of the cabinet is provided a fan door extending over an entirety of the rear, the fan door can be brought about a pivot pin into an open position and at least one heat exchanger is fixed rigidly in a vicinity of the pivotable fan door.

23. The apparatus according to claim 1, wherein the fans, which supply the air-to-liquid heat exchanger with the exhaust air supplied with heat loss from the cabinet, are located downstream of the air-to-liquid heat exchanger.

\* \* \* \* \*